(12) United States Patent
Sun (10) Patent No.: US 12,048,192 B2
(45) Date of Patent: Jul. 23, 2024

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Jiajia Sun, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 395 days.

(21) Appl. No.: 17/622,824

(22) PCT Filed: Dec. 21, 2021

(86) PCT No.: PCT/CN2021/139876
§ 371 (c)(1),
(2) Date: Dec. 26, 2021

(87) PCT Pub. No.: WO2023/108706
PCT Pub. Date: Jun. 22, 2023

(65) Prior Publication Data
US 2023/0189558 A1    Jun. 15, 2023

(51) Int. Cl.
*H01L 51/50* (2006.01)
*H10K 50/84* (2023.01)
*H10K 50/858* (2023.01)

(52) U.S. Cl.
CPC ........... *H10K 50/858* (2023.02); *H10K 50/84* (2023.02)

(58) Field of Classification Search
CPC .... H10K 59/1201; H10K 59/40; H10K 59/87; H10K 50/844; H10K 59/873
See application file for complete search history.

(56) References Cited

U.S. PATENT DOCUMENTS

| 2019/0081129 A1 | 3/2019 | Sung et al. |
| 2020/0203660 A1* | 6/2020 | Shi .................. H10K 77/10 |
| 2021/0234125 A1 | 7/2021 | Sung et al. |

FOREIGN PATENT DOCUMENTS

| CN | 109671864 A | 4/2019 |
| CN | 109728194 A | 5/2019 |
| CN | 110120463 A | 8/2019 |
| CN | 110211998 A | 9/2019 |
| CN | 110993817 A | 4/2020 |

(Continued)

OTHER PUBLICATIONS

International Search Report in International application No. PCT/CN2021/139876, mailed on Sep. 14, 2022.

(Continued)

*Primary Examiner* — John A Bodnar
(74) *Attorney, Agent, or Firm* — Rivka Friedman (57) ABSTRACT

A display panel includes a display area and a non-display area disposed on at least one side of the display area, and further includes an array substrate, a first optical structure layer, and a second optical structure. The first optical structure layer is provided with a plurality of pixel openings, grooves, and dams. The dams and the grooves intersect with an edge of the non-display area at an included angle, and the included angle is 80° to 100°.

20 Claims, 6 Drawing Sheets

(56) References Cited

FOREIGN PATENT DOCUMENTS

| CN | 111584765 A | 8/2020 |
|---|---|---|
| CN | 113287198 A | 8/2021 |
| CN | 113437048 A | 9/2021 |

OTHER PUBLICATIONS

Written Opinion of the International Search Authority in International application No. PCT/CN2021/139876, mailed on Sep. 14, 2022.
Chinese Office Action issued in corresponding Chinese Patent Application No. 202111521777.9 dated Jan. 28, 2023, pp. 1-8.

* cited by examiner

DISPLAY PANEL

FIELD OF INVENTION

The present disclosure relates to a technical field of manufacturing display panels and display devices, and particularly to a display panel.

BACKGROUND

Compared with conventional liquid crystal display (LCD), organic light-emitting diode (OLED) has advantages of light weight, wide viewing angle, and high luminous efficiency.

With advent of a 5G era, power consumption of a screen has become one of most important parameters perceived by consumers. In order to reduce power consumption of an OLED panel and efficiency of a screen, in the prior art, a micro-lens pattern (MLP) is generally disposed in an OLED screen according to geometric optics and converges a relatively divergent light emitted by the OLED screen to a top of the screen to improve the efficiency of the OLED screen. However, when preparing the aforementioned micro-lens pattern, the micro-lens pattern generally needs to be planarized by ink jet printing (IJP) to facilitate subsequent manufacturing processes. Furthermore, in order to prevent an ink from overflowing during ink jet printing, it is also necessary to dispose blocking structures, such as grooves and dams, around the screen in advance. In a final product, an excess part of the blocking structures at periphery needs to be removed. In order to ensure cutting effect, it is generally necessary to cut multiple times. However, adhesion between the dam and layers formed by the prior art is relatively strong. When cutting, the dams are easily torn from the layers attached to them. For example, in the last cutting, the dams formed from the MLP are easily torn at junctions between them and adjacent layers, thereby reducing a quality and reliability of a display panel.

Therefore, it is necessary to provide a solution to solve the problem in the prior art.

In the above, in the prior art, when cutting off redundant parts of dams formed from a micro-lens pattern, the MLP dams are easily torn from adjacent layers, thereby reducing a quality and reliability of a panel.

SUMMARY OF DISCLOSURE

In order to solve the above technical problem, the present disclosure provides a display panel to effectively improve the problem of tearing between the dams and the layers when the micro-lens pattern is cut off, and improve a quality and reliability of the display panel.

In order to solve the above technical problem, the present disclosure provides the following technical solutions.

In a first aspect, the present disclosure provides a display panel comprising a display area and a non-display area disposed on at least one side of the display area. The display panel further comprises:

an array substrate;
a first optical structure layer disposed on the array substrate and provided with a plurality of pixel openings in the display area, at least two grooves in the non-display area, and one dam between two adjacent grooves, wherein each of the grooves intersects with an edge of the non-display area away from the display area at a first included angle in an extending direction of each of the grooves, and the first included angle is 80° to 100°; and
a second optical structure layer disposed on the first optical structure layer and filling the pixel openings, wherein a refractive index of the second optical structure layer is greater than a refractive index of the first optical structure layer, and a thickness of a part of the second optical structure layer corresponding to an edge of the display area is greater than a thickness of a part of the second optical structure layer in the non-display area.

In an embodiment, a sidewall of each of the grooves intersects with the edge of the non-display area away from the display area in the extending direction of each of the grooves at a second included angle, and the second included angle is 80° to 100°.

In an embodiment, a central axis of each of the grooves intersects with the edge of the non-display area away from the display area in the extending direction of each of the grooves at a third included angle, and the third included angle is 80° to 100°.

In an embodiment, each of both ends of each of the grooves extends to intersect with the edge of the non-display area away from the display area at the first included angle.

In an embodiment, the first included angle, the second included angle, and the third included angle are all 90°.

In a second aspect, the present disclosure further provides a display panel, comprising a display area and a non-display area disposed on at least one side of the display area, and further comprising:

an array substrate;
a first optical structure layer disposed on the array substrate and provided with a plurality of pixel openings in the display area, at least two grooves in the non-display area, and one dam between two adjacent grooves, wherein each of the grooves intersects with an edge of the non-display area away from the display area at a first included angle in an extending direction of each of the grooves, and the first included angle is 80° to 100°; and
a second optical structure layer disposed on the first optical structure layer and filling the pixel openings, wherein a refractive index of the second optical structure layer is greater than a refractive index of the first optical structure layer.

In an embodiment, a sidewall of each of the grooves intersects with the edge of the non-display area away from the display area in the extending direction of each of the grooves at a second included angle, and the second included angle is 80° to 100°.

In an embodiment, a central axis of each of the grooves intersects with the edge of the non-display area away from the display area in the extending direction of each of the grooves at a third included angle, and the third included angle is 80° to 100°.

In an embodiment, each of both ends of each of the grooves extends to intersect with the edge of the non-display area away from the display area at the first included angle.

In an embodiment, the first included angle, the second included angle, and the third included angle are all 90°.

In an embodiment, each of the grooves comprises:
a first groove portion;
a second groove portion intersecting with the edge of the non-display area away from the display area; and
a groove connecting portion connecting the first groove portion and the second groove portion;

wherein widths of the first groove portion and the second groove portion are both less than a width of the groove connecting portion.

In an embodiment, the width of the first groove portion is same as the width of the second groove portion.

In an embodiment, in two adjacent grooves, a width of the groove connecting portion of the groove close to the display area is greater than a width of the groove connecting portion of the groove away from the display area.

In an embodiment, in two adjacent grooves, a width of the first groove portion of the groove close to the display area is equal to a width of the first groove portion of the groove away from the display area, and a width of the second groove portion of the groove close to the display area is equal to a width of the second groove portion of the groove away from the display area.

In an embodiment, the dam intersects with the edge of the non-display area away from the display area, at an intersection, a first tangent formed by an edge trajectory corresponding to the edge of the non-display area and a second tangent formed by a dam trajectory corresponding to the dam form a fourth included angle, and the fourth included angle is 80° to 100°.

In an embodiment, the intersection is an intersection of a contour of the dam and the edge trajectory of the edge of the non-display area away from the display area, and the dam trajectory is the contour of the dam.

In an embodiment, the intersection is an intersection of a central axis of the dam in an extending direction of the dam and the edge trajectory of the edge of the non-display area away from the display area, and the dam trajectory is the central axis of the dam in the extending direction of the dam.

In an embodiment, each of the dams comprises a first straight portion, a second straight portion, and a curved portion located between the first straight portion and the second straight portion, and the second straight portion intersects with the edge of the non-display area of the display panel.

In an embodiment, the dam comprises a first dam and a second dam disposed adjacently, one groove is disposed between the first dam and the second dam, and the first dam is close to the edge of the non-display area.

In an embodiment, the display panel further comprises:
 a light-emitting layer disposed on the array substrate and comprising a plurality of pixels disposed corresponding to the pixel openings;
 an encapsulation layer disposed on the light-emitting layer; and
 a touch layer disposed on the encapsulation layer and comprising a touch metal layer, wherein the touch metal layer comprises a touch metal grid corresponding to the pixels, and the first optical structure layer is disposed on the touch metal layer.

In summary, the present disclosure has the following beneficial effects.

The present disclosure provides a display panel and a display device. The display panel comprises an array substrate, a first optical structure layer, and a second optical structure layer. The first optical structure layer comprises a plurality of pixel openings, grooves, and dams located between the grooves. The second optical structure layer fills the pixel openings and the grooves. The dams intersect with an edge of a non-display area of the display panel at an included angle, and the included angle is 80° to 100°. The dams is cut to form a final display panel. During cutting, the dams and layers are tightly bonded without tearing, thereby effectively improving a quality and reliability of the display panel.

DETAILED DESCRIPTION

The following description of various embodiments of the present disclosure with reference to the accompanying drawings is used to illustrate specific embodiments that can be practiced.

With continuous development of display panel manufacturing technology, people have put forward higher requirements on performance and quality of display panels, and hope that the manufactured display panels not only have better quality, but also have better overall performance.

Figure 1:
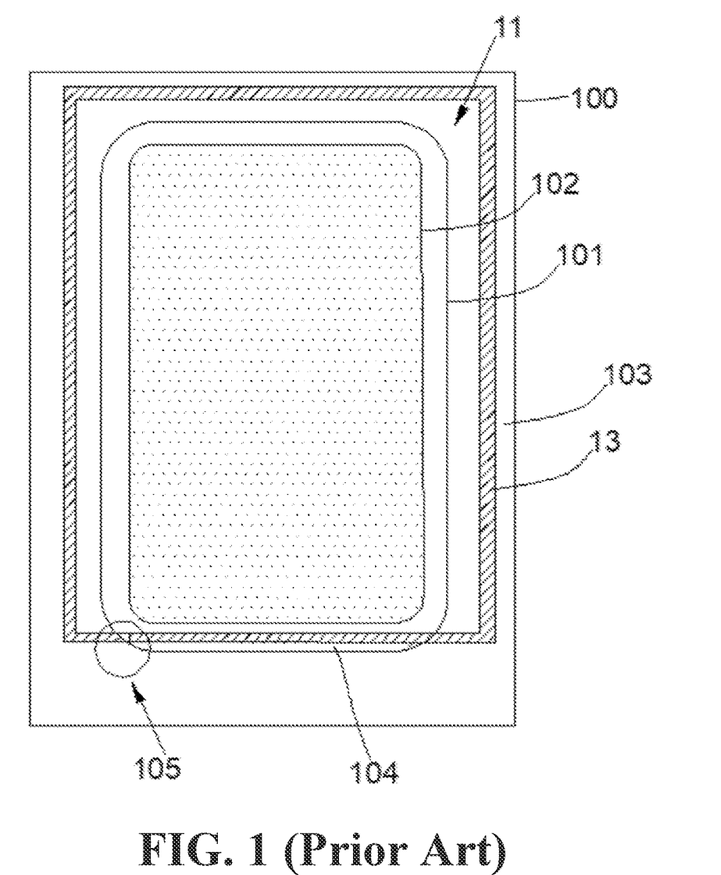
FIG. 1 is a schematic diagram of a display panel in the prior art.

During a process of manufacturing a display panel, multiple steps are required, especially a display panel with multiple layers and complex structure. For example, when manufacturing an OLED device with a micro-lens pattern, there are more steps, and it is necessary to ensure performance of each layer during the process. Please refer to FIG. 1. FIG. 1 is a schematic diagram of a display panel in the prior art. In a manufacturing process, it is necessary to first form a display panel 100 with a larger-size, and then cut the display panel 100 with the larger-size to finally form a panel with a required size. Specifically, before forming optical structure layers corresponding to a micro-lens pattern by ink jet printing, it is necessary to first form at least one circle of groove 13 in a non-display area 11 of the display panel, so that two dams 103 are correspondingly formed on opposite sides of the groove 13. The groove 13 and the dams 103 restrict a flow of ink, thereby ensuring formation of the micro-lens pattern with better performance.

Redundant parts of the dams 103 in the non-display area 11 and one corresponding part of the groove 13 will be cut and removed. For example, by cutting along preset two cutting lines 101, excess parts of the dams at periphery will be cut off, and retaining parts 104 of the dams will eventually be left. Then, a boundary 102 of a display area is processed. In the prior art, when the dams 103 are removed through multiple cuttings, the dams 103 are easily torn from adjacent layers. Especially, when the display panel is cut along the two cutting lines 101, the layers near a curvilineal cutting area 105 where the dams 103 intersect with the two cutting lines 101 are more likely to be torn from each other, thereby reducing a quality and reliability of the display panel.

The present disclosure provides a display panel. By improving structures of dams and the display panel, the dams are effectively prevented from being torn from layers when the dams are cut.

Figure 2:
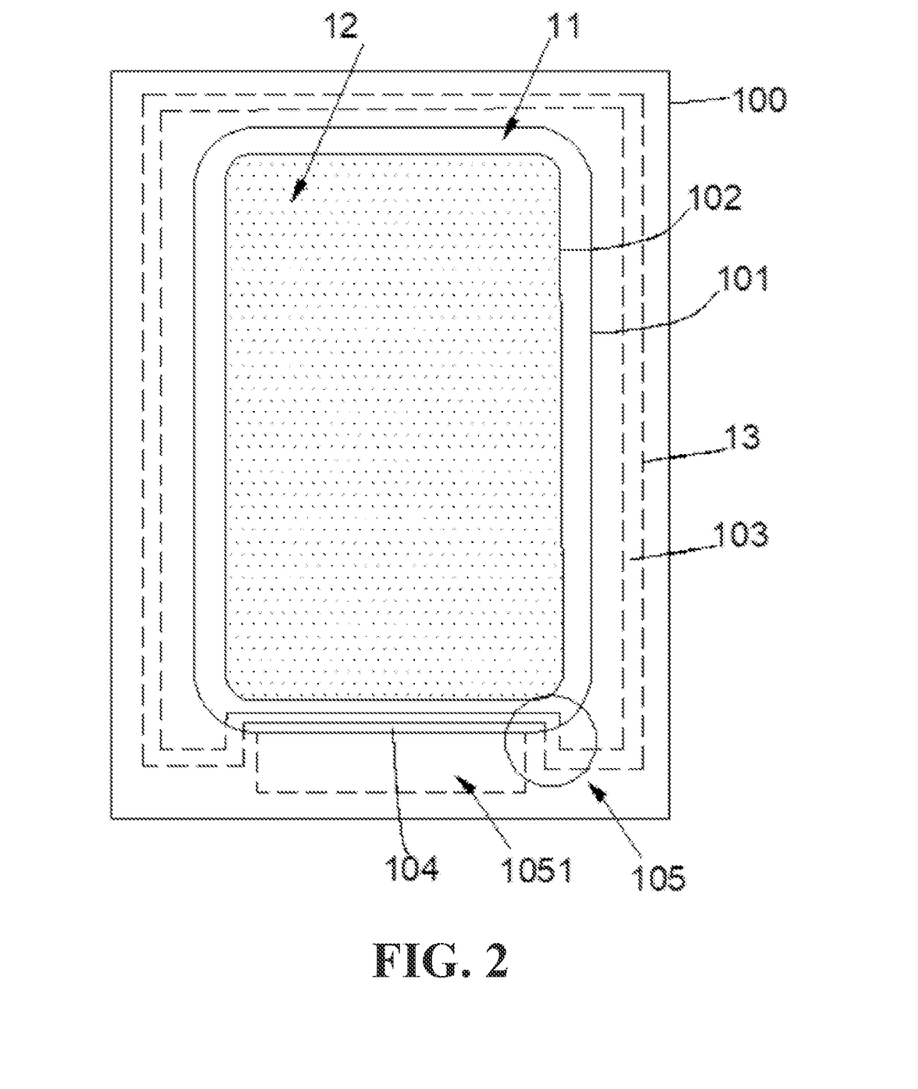
FIG. 2 is a schematic structural diagram of a display panel according to an embodiment of the present disclosure.

Specifically, please refer to FIG. 2. FIG. 2 is a schematic structural diagram of a display panel according to an embodiment of the present disclosure. The display panel 100 shown in FIG. 2 is an intermediate pre-formed product. The display panel 100 with a larger size needs to be cut to finally form a panel required in this embodiment of the present disclosure.

When manufacturing the display panel with a micro-lens pattern (MLP) of this embodiment, it is necessary to form at least two circles of grooves 13 in a non-display area 11 before the micro-lens pattern is formed by ink jet printing, so that dams 103 are correspondingly formed between two adjacent grooves and on opposite sides of each of the grooves. In this embodiment, more circles of grooves and corresponding dams may be provided to restrict flow of a material, and their arrangements are same as that in this embodiment.

After formation is completed, the pre-formed display panel 100 needs to be cut. In this embodiment, two cutting processes are taken as an example for description. It may also be set to three or more cutting processes according to actual needs, which will not be described in detail herein.

When a second cutting process of the two cutting processes is performed, cutting is performed along a boundary 101 of the non-display area 11. That is, the boundary 101 of the non-display area 11 is where two cutting lines are located. After the cutting is completed, unnecessary structures outside the non-display area 11 will be removed. For example, excess parts of the dams 103 or excess parts of the grooves 13 are cut off, leaving only retaining parts 104 of the dams and parts of the grooves 13 corresponding to the retaining parts. The retaining parts 104 of the dams and the remaining parts of the grooves 13 are located in the non-display area 11 and between the display boundary 102 of the display area 12 and the boundary 101 of the non-display area.

Specifically, in this embodiment, at one side of the display panel 100, each of the dams 103 is set in a concave or U-shaped structure, each of two grooves on opposite sides of each of the dams 103 is correspondingly set in a concave or U-shaped structure. For example, in a bending area 1051 corresponding to the non-display area at a lower end of the display panel 100, each groove 13 and one corresponding dam 103 are bent and folded upward, and then a horizontal part of the dam is disposed, so as to form a bent portion 105. Furthermore, each of the dams is cut along the two cutting lines 101 at the bent portion 105. In this embodiment, when the bent portion 105 is disposed, the bent portion 105 may be disposed between the boundary 102 of the display area and the boundary 101 of the non-display area. Furthermore, when cutting the dams or the grooves at the bent portions 105, the cutting lines pass through the bent portions 105. Therefore, an included angle is formed between the boundary 101 (i.e. the cutting lines) of the non-display area and each of two ends of the retaining part 104 of each of the dams.

In this embodiment, a side wall of each dam is a side wall of one corresponding groove, so a contour of the dam is equivalent to a contour of the groove. The grooves are filled with layers. When cutting the layers in this area along the cutting lines, an included angle between a cutting trajectory and a dam trajectory is equivalent to an included angle between the cutting trajectory and the layers in each groove. Therefore, in the following embodiments, an included angle formed between each dam and the cutting trajectory is actually equivalent to an included angle formed between each groove and the cutting trajectory.

In this embodiment, when the bent portion 105 is disposed, parts of the dams 104 that has not been cut and removed may be located on a side of a binding end of the display panel 100 to facilitate subsequent binding processes of the panel.

Figure 3:
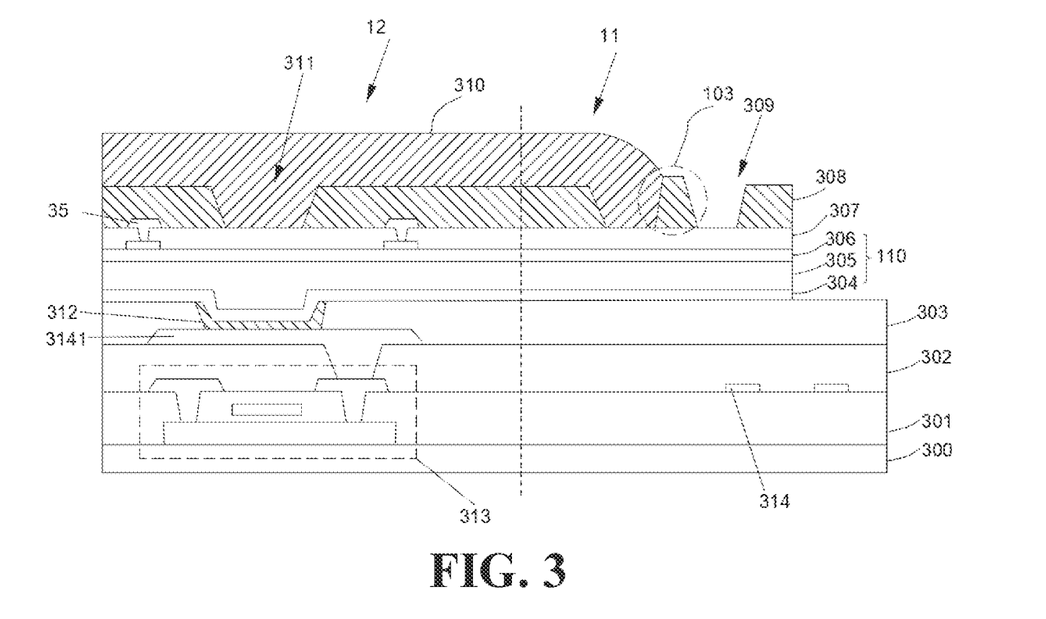
FIG. 3 is a schematic cross-sectional view of the display panel according to an embodiment of the present disclosure.

Furthermore, please refer to FIG. 2 and FIG. 3. FIG. 2 is a top view of the display panel. FIG. 3 is a schematic cross-sectional view of the display panel according to an embodiment of the present disclosure. The display panel provided in this embodiment is a display panel with a micro-lens pattern (MLP). Specifically, the display panel comprises a base substrate 300, an array substrate 301, a planarization layer 302, and a pixel definition layer 303. Specifically, the array substrate 301 is disposed on the base substrate 300, the planarization layer 302 is disposed on the array substrate 301, and the pixel definition layer 303 is disposed on the planarization layer 302.

In this embodiment, the base substrate 300 may be a flexible base substrate, such as a flexible base substrate made of polyimide, or a base substrate made of other flexible materials. Furthermore, the array substrate 301 provided in this embodiment is a thin film transistor array substrate. The array substrate 301 comprises a thin film transistor 313, a plurality of interlayer dielectric layers, and a plurality of electrodes each disposed on one corresponding interlayer dielectric layer, for example, functional layers such as a source electrode, a drain electrode, an active layer, and a gate layer of the thin film transistor disposed in the array substrate 301, and an electrode layer 314 disposed on the array substrate 301. When disposing the aforementioned layers and devices, they may be manufactured according to a conventional manufacturing technology of an array substrate. A specific manufacturing process will not be described in detail herein. After the manufacturing process is completed, the array substrate in this embodiment is finally formed.

Furthermore, the planarization layer 302, a connecting electrode 3141, and the pixel definition layer 303 are disposed on the array substrate 301. The planarization layer 302 is disposed on the array substrate 301 and covers the source electrode or the drain electrode of the thin film transistor and the electrode layer 314. The pixel definition layer 303 is disposed on the planarization layer 302 and covers the connecting electrode 3141. The connecting electrode 3141 is electrically connected to the source electrode or the drain electrode of the thin film transistor 313 through a corresponding via hole, so as to realize transmission of a control signal. In this embodiment, an opening is formed on the connecting electrode 3141. A light-emitting layer 312 is disposed in the opening. The light-emitting layer 312 is electrically connected to the connecting electrode 3141. The thin film transistor provides a control signal to the light-emitting layer 312 through the connecting electrode 3141, so that the light-emitting layer 312 normally emits light.

Furthermore, a thin film encapsulation layer 110 is disposed on the pixel definition layer 303, and a touch layer 307 is disposed on the thin film encapsulation layer 110. In this embodiment, when the thin film encapsulation layer 110 is disposed, the thin film encapsulation layer 110 may be formed by stacking a plurality of layers, for example, by stacking organic materials and inorganic materials. Specifically, the thin film encapsulation layer 110 comprises a first inorganic barrier layer 304 disposed on the pixel definition layer 303, an organic planarization layer 305 disposed on the first inorganic barrier layer 304, and disposed on the organic planarization layer 305. The display panel is packaged with the aforementioned inorganic-organic-inorganic layer stack structure, which ensures performance of the display panel.

In this embodiment, the touch layer 307 is disposed on the thin film encapsulation layer 110. The touch layer 307 comprises a touch metal layer. In this embodiment, the touch metal layer 35 comprises a touch metal grid corresponding to light-emitting pixels of the display panel. By setting the touch metal layer 35 into a grid structure, touch operation on the touch layer 307 can be realized, and a light emitting effect of the panel can be improved.

Furthermore, the display panel provided in this embodiment further comprises a micro-lens pattern layer. Specifically, the micro-lens pattern layer may comprise one layer or multiple layers. In this embodiment, the micro-lens pattern layer comprises a first optical structure layer 308 and a second optical structure layer 310 as an example for description.

The first optical structure layer 308 is disposed on the touch metal layer of the touch layer 307. The second optical structure layer 310 is disposed on the first optical structure layer 308. When the first optical structure layer 308 is disposed, the first optical structure layer 308 is disposed in the display area 12 and the non-display area 11 of the display panel, and is provided with openings in the display area 12 and the non-display area 11. Specifically, in the display area 12 of the display panel, the first optical structure layer 308 is provided with a plurality of pixel openings 311. The pixel openings 311 may correspond to pixel units of the display panel. For example, a projection of one pixel opening 311 on the base substrate 300 coincides with a projection of one opening, where the light-emitting layer 312 in the display panel is located, on the base substrate 300. Alternatively, an area of the projection of one pixel opening 311 of the first optical structure layer 308 is greater than an area of the projection of to one corresponding opening where the light-emitting layer 312 is located, which ensures that a light emitted by the light-emitting layer 312 can reach the pixel opening 311 as much as possible, and be emitted from the pixel opening 311.

Furthermore, when the pixel openings 311 are formed, shapes and sizes of the pixel openings 311 may be set to be same, or may be set according to required specifications. In this embodiment, in order to ensure the light emitting effect, the pixel opening 311 may penetrate the first optical structure layer 308.

In this embodiment, a portion of the first optical structure layer 308 corresponding to the non-display area 11 is further provided with one or more grooves 309. Specifically, the grooves 309 may be arranged around the display area 12 of the display panel, for example, at least two circles of grooves 309, or multiple circles of grooves. Because the grooves are provided, dams are formed on opposite sides of each of the grooves, such as the dams 103 shown in FIG. 3. Specifically, the grooves and dams may be set according to actual product requirements, and will not be described in detail herein. There is a certain interval between two circles of grooves 309. When the grooves 309 are set as multiple circles, every two adjacent grooves 309 may have a same interval. An outermost groove 309 is as close as possible to an edge of the non-display area 11 to realize a panel with a narrow frame.

Furthermore, the second optical structure layer 310 is disposed on the first optical structure layer 308. The second optical structure layer 310 fills the pixel openings 311 of the first optical structure layer 308, so that a plurality of micro-lenses are formed in the pixel openings 311. Preferably, each of the micro-lenses may comprise a protrusion embedded in one corresponding pixel opening to act on light. Moreover, the second optical structure layer 310 fills the grooves 309 of the first optical structure layer 308.

In this embodiment, both the first optical structure layer 308 and the second optical structure layer 310 are made of a transparent material. Refractive indexes of the two optical structure layers are different. Preferably, an optical refractive index of the first optical structure layer 308 may be less than an optical refractive index of the second optical structure layer 310. The second optical structure layer 310 is made by ink jet printing. After the ink jet printing is completed and cured, a layer as shown in FIG. 3 is formed.

Figure 4:
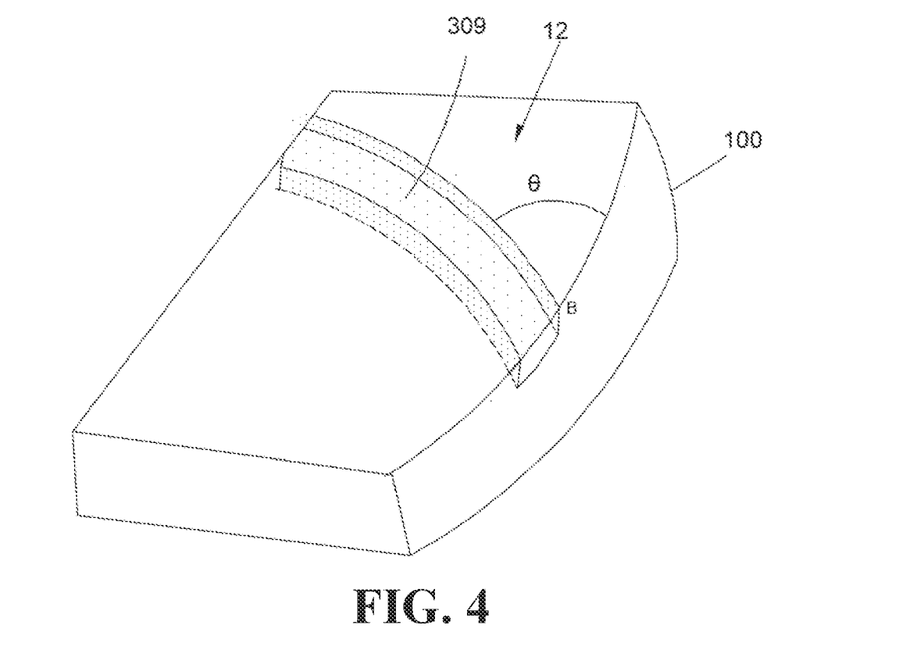
FIG. 4 is a schematic diagram of a groove and an edge cutting line of the display panel according to an embodiment of the present disclosure.

Layers shown in FIG. 3 need to be cut to remove excess parts. During a cutting process, parts of the dams 103 in the non-display area 11 and layers filled in a corresponding part of the grooves 309 are cut off. During the cutting process, higher temperatures are generated, and organic layers are easily torn or peeled off at high temperatures. Please refer to FIG. 1 to FIG. 3. FIG. 4 is a schematic diagram of one groove 309 and an edge cutting line of the display panel according to an embodiment of the present disclosure. In this embodiment, in order to ensure adhesion between the dams and the touch layer 307 or other layers, and to prevent cracks between adjacent layers, when setting the dams or grooves and the two cutting lines corresponding to the layers, the two cutting lines cut the grooves 309 and intersect with the edge of the non-display area of the display panel 100. Because contours of the two structures intersect with the edge, there is an included angle θ between each of the grooves 309 and the edge of the non-display area away from the display area in an extending direction of each of the grooves 309. In this embodiment, the included angle θ is 80° to 100°.

In this embodiment, the side wall of each dam is the side wall of one corresponding groove, so the contour of the dam is equivalent to the contour of the groove. The grooves are filled with the second optical structure layer. When cutting the layers in this area along the cutting lines, an included angle between a cutting trajectory and a dam trajectory is equivalent to an included angle between the cutting trajectory and the second optical structure layer in each groove, the two included angles are actually same.

Figure 5:
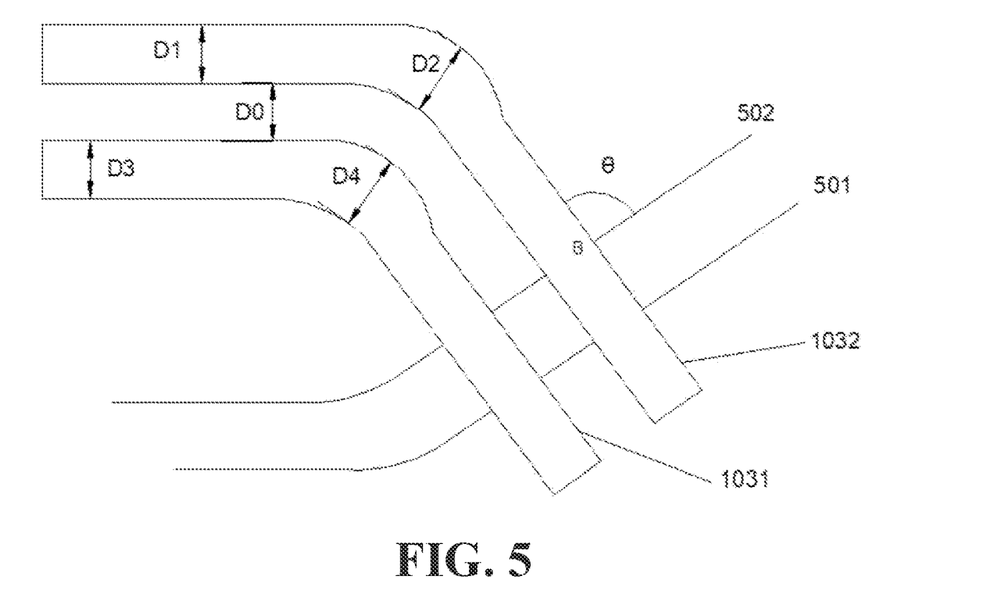
FIG. 5 is a schematic plan view of an intersection of two grooves and the edge cutting line according to an embodiment of the present disclosure.

Specifically, please refer to FIG. 5. FIG. 5 is a schematic plan view of an intersection of two grooves and the edge cutting line according to an embodiment of the present disclosure. In this embodiment, a first groove 1031, a second groove 1032, a first cutting line 501, and a second cutting line 502 are taken as examples. When a circle of groove is further provided on a side of the second groove 1032, a first dam and a second dam will be formed between the above grooves. The first groove 1031 or its corresponding first dam is located away from the display area. The second groove 1032 or its corresponding second dam is located between the first groove 1031 and the display area. The second cutting line 502 is a boundary of the non-display area of the display panel away from the display area, that is, an outer edge of the non-display area. After cutting along the second cutting line 502, only a part inside the second cutting line 502 remains.

Preferably, during cutting, an included angle θ formed between a trajectory corresponding to the edge of the non-display area and a trajectory corresponding to one groove or one dam corresponding to the groove is between 80° and 100°. In this embodiment, when the second groove 1032 intersects with the second cutting line 502 at a point B, and their trajectories are straight at the point B, the included angle θ formed between the two trajectories is an included angle θ formed between one groove and one cutting line, that is, a first included angle θ. The first included angle θ is 80° to 100°, preferably 90°, so as to effectively prevent the dams from being torn from other layers.

Figure 6:
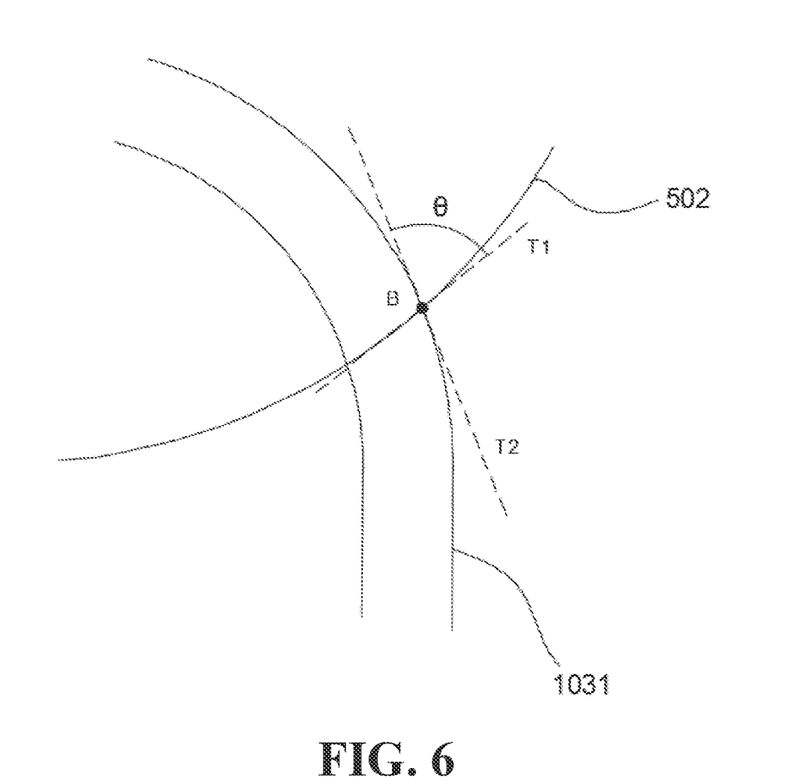
FIG. 6 and FIG. 7 are schematic diagrams of a second cutting line at different positions of one groove according to an embodiment of the present disclosure.
Figure 7:
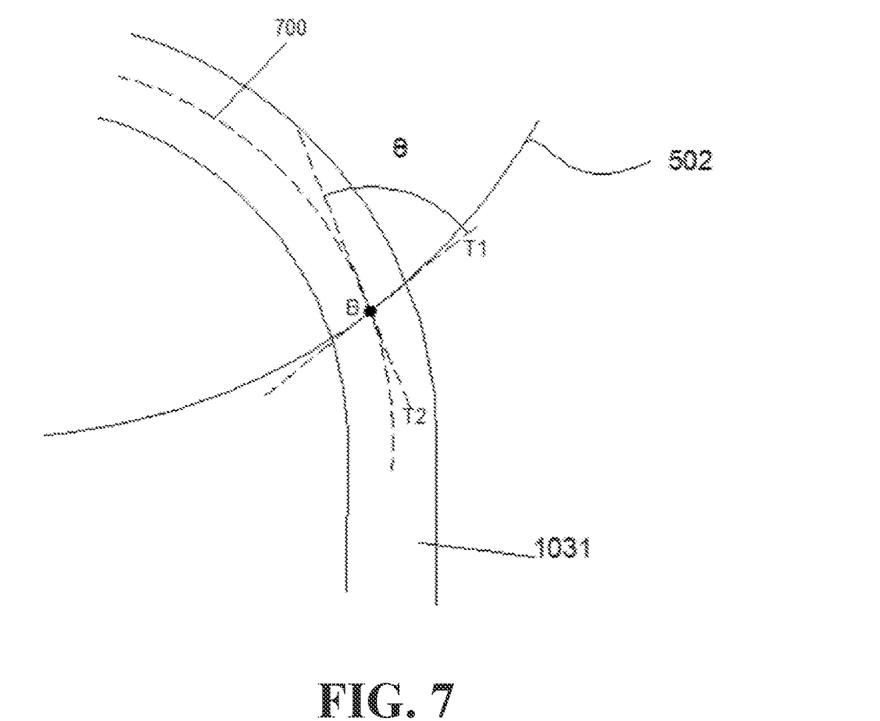

Furthermore, please refer to FIG. 6 and FIG. 7. FIG. 6 and FIG. 7 are schematic diagrams of the second cutting line at different positions of one groove according to an embodiment of the present disclosure. In FIG. 6, the second cutting line 502 intersects with the first groove 1031 at the point B, and the first groove 1031 and the second groove 1032 are cut along the second cutting line 502. In this embodiment, at the point B, an edge trajectory corresponding to the second cutting line 502 is a curve, and a dam trajectory corresponding to the first groove is also a curve. Therefore, when measuring an included angle between the two trajectories, first find two tangent lines T respectively corresponding to the two trajectories at the point B, and then make the included angle formed between the two tangent lines T be 80° to 100°, so as to ensure a cutting quality of the display panel.

Specifically, please refer to FIG. 6, The first groove 1031 intersects with the second cutting line 502 at the point B. The dam trajectory corresponding to the first dam 1031 has a second tangent T2 at the point B. The edge trajectory corresponding to the second cutting line 502 has a first tangent T1 at the point B. In this embodiment, a second included angle θ formed between the first tangent T1 and the second tangent T2 is 80° to 100°.

In this embodiment, when outer contours of opposite sides of the first groove 1031 are same, that is, when cross-sectional shapes of the first groove and its corresponding first dam are regular shapes everywhere, the outer contours of the opposite sides of the first groove 1031 are trajectories. A second included angle θ formed between the second tangent T2 formed by one outer contour and the first tangent T1 formed by the cutting line is 80° to 100°. Preferably, the second included angle is 90°.

Furthermore, please refer to the schematic plan view of FIG. 7. Take the schematic plan view of the first groove 1031 as an example for description. In this case, the outer contours of the opposite sides of the first groove 1031 are irregular contours. When measuring an included angle at an intersection point, a central axis 700 of the first groove 1031 in an extending direction of the first groove 1031 intersects the second cutting line 502 at the point B. A second tangent T2 is formed at the point B by the central axis 700 in the extending direction of the first groove 1031. The first tangent T1 is formed by the edge trajectory of the non-display area. A third included angle θ is formed between the first tangent T1 and the second tangent T2. The third included angle θ is 80° to 100°. Preferably, the third included angle is 90°. At this time, a trajectory of the groove is the central axis of the groove. When cutting along a direction of a width of the groove, the center axis in the extension direction is a center line of a cross-section of the groove at the point B.

Specifically, the groove is cut along the second cutting line 502. The included angle θ is formed between the first tangent T1 and the second tangent T2. The included angle θ has a supplementary angle. The supplementary angle corresponding to the included angle θ is also 80° to 100°, which also can satisfy a cutting effect in this embodiment. In this embodiment, both ends of the groove intersect with the edge of the panel at the included angle θ.

Furthermore, please refer to the schematic diagram of FIG. 5. When the first groove 1031 and the second groove 1032 are formed, a distance between the first groove 1031 and the second groove 1032 is same at different positions. That is, a width (i.e. a distance D0 shown in FIG. 5) of the dam formed between the two grooves is same. The distance D0 is same at different positions, so as to ensure consistency of two different dams.

Furthermore, a cross-sectional width of the first groove 1031 is D3, and a cross-sectional width of the second groove 1032 is D1. A middle area of the first groove 1031 is provided with a bent part, a cross-sectional width of the bent part is D2. A middle area of the second groove 103 is also provided with a bent part, which is a connecting portion of the groove, and a cross-sectional width of the bent part is D4.

In order to ensure the adhesion between the grooves and adjacent layers during cutting, and prevent tearing, in this embodiment, the cross-sectional width of the bent part in the middle area D of each groove is greater than cross-sectional widths of other parts of each groove. That is, D2>D1, and D4>D3. Furthermore, it may make D1=D3, D2>D4. That is, the cross-sectional width of the bent part of the groove close to the display area is greater than the cross-sectional width of the bent part away from the display area, thereby ensuring that the display panel has a better cutting quality when cutting.

Figure 8:
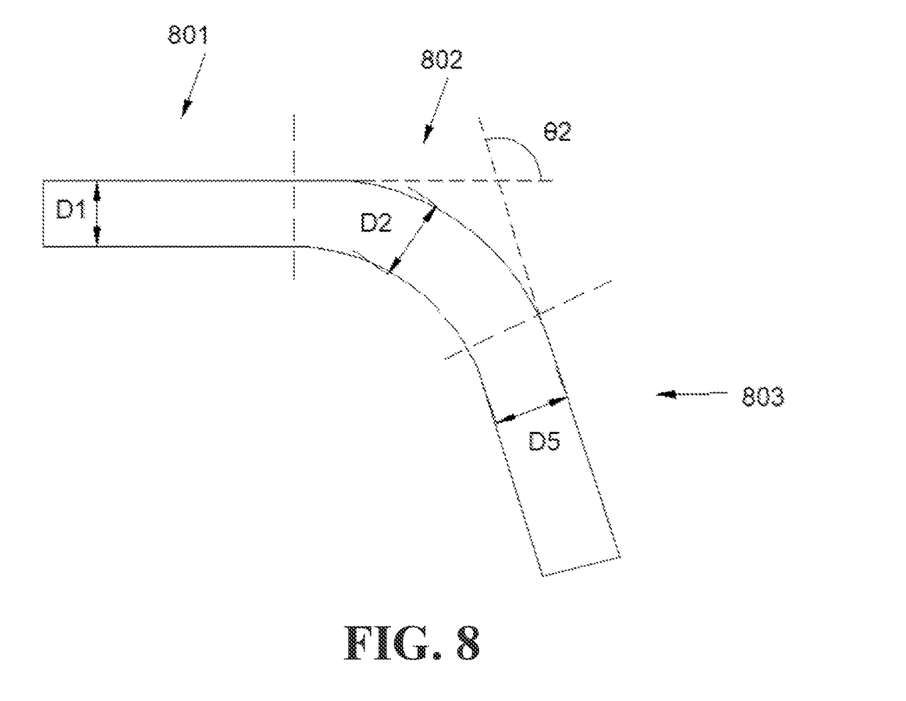
FIG. 8 is a schematic plan view of one groove according to an embodiment of the present disclosure.

Specifically, please refer to FIG. 8. FIG. 8 is a schematic plan view of one groove according to an embodiment of the present disclosure. In this embodiment, the second groove 1032 is taken as an example for description. Shapes of other grooves or their corresponding dams are same as a shape of the second groove 1032, which will not be described in detail herein.

Specifically, one groove may comprise multiple sections, such as a first groove portion 801, a second groove portion 803, and a groove connecting portion 802. The groove connecting portion 802 is disposed between the first groove portion 801 and the second groove portion 803. Specifically, the first groove portion 801 may be disposed in a horizontal direction, that is, disposed in parallel with a first side of a bottom frame of the display panel. There is an included angle θ2 between an extension line of the second groove portion 803 and an extension line of the first groove portion 801. In order to prevent greater stress at the groove connecting portion 802, in this embodiment, the included angle θ2 is a right angle or an obtuse angle.

When θ2 is the right angle of 90°, the first groove portion 801 is parallel to the first side of the display panel, and the second groove portion 803 is parallel to a second side adjacent to the first side of the display panel. The connecting portion is arc-shaped. Two ends of the groove connecting portion 802 are tangent to the first groove portion 801 and the second groove portion 803.

When θ2 is the obtuse angle, θ2 is 100° to 170°, thereby effectively reducing a bending stress in the groove connecting portion 802. In this embodiment, a length of the groove connecting portion 802 in the horizontal direction and a length in a vertical direction may be set according to a width of a non-display area of an actual product, and their specific value is not limited herein. However, it is ensured that an included angle between a tangent formed by one cutting line and a tangent formed by one groove is within a range set in this embodiment.

Furthermore, a cross-sectional width of the first groove portion 80 is D1, a cross-sectional width of the second groove portion 803 is D5, and a cross-sectional width of the groove connecting portion 802 is D2. In this embodiment, D1=D5, and D2>D1.

When there are multiple grooves, a width of the groove connecting portion of the groove close to the display area is greater than a width of the groove connecting portion of the groove away from the display area. A width of the first groove portion of the groove close to the display area is equal to a width of the first groove portion of the groove away from the display area. A width of the second groove portion of the groove close to the display area is equal to a width of the second groove portion of the groove away from the display area. Therefore, a cutting effect for the dams is ensured.

Furthermore, when multiple grooves are provided, one dam is formed between two adjacent grooves. After the cutting process is completed, two ends of the dam intersect with the edge of the non-display area away from the display area. At the intersection, the first tangent formed by the edge of the panel and the second tangent formed by the dam trajectory corresponding to the dam form a fourth included angle, and the fourth included angle is 80° to 100°. The dam trajectory is the outer contour of the dam or the central axis of the dam in the extending direction of the dam. A method for determining the first tangent and the second tangent is same as a method for determining the first tangent and the second tangent formed by the groove, and will not be described in detail herein.

Specifically, each dam comprises a first straight portion, a second straight portion, and a curved portion located between the first straight portion and the second straight portion, and the second straight portion intersects with the edge of the non-display area of the display panel. The first straight portion of the dam corresponds to the first groove portion of the groove. The second straight portion of the dam corresponds to the second groove portion of the groove. The curved portion of the dam corresponds to the groove connecting portion of the groove. Accordingly, there is a one-to-one correspondence between portions of the groove and portions of the dam in this embodiment.

Furthermore, a cross-sectional shape of the groove connecting portion 802 may also be other non-circular shapes, such as an irregular arc shape.

Please refer to FIG. 5 to FIG. 7. When cutting the non-display area along the cutting line to the groove or the dam corresponding to the groove, the second cutting line 502 may be located at the second groove portion 803, or the second cutting line 502 may be located at the groove connecting portion 802.

When the second cutting line 502 is located at the second groove portion 803, an included angle between an outermost contour of the second groove portion 803 and the second cutting line 502 is the included angle θ2 of this embodiment, and the included angle θ2 is 80° to 100°.

When the second cutting line 502 is located at the bent part corresponding to the groove connecting portion 802, the included angle may be determined according to methods set in FIG. 5 and FIG. 6, and the included angle θ is ensured to be 80° to 100°, so as to ensure that quality problems such as tearing will not occur between the dam corresponding to the groove and adjacent layers during the cutting process.

Figure 9:
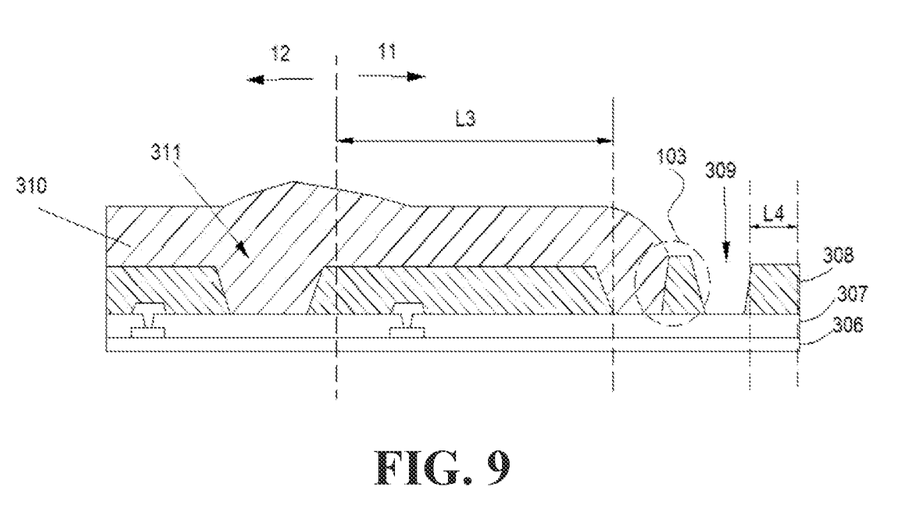
FIG. 9 is a schematic structural diagram of one groove according to an embodiment of the present disclosure.

Furthermore, please refer to FIG. 9. FIG. 9 is a schematic structural diagram of one groove according to an embodiment of the present disclosure. For a display panel with a narrow frame, the groove 309 provided in the non-display area 11 and the dams on the opposite sides of the groove 309 need to be limited to realize the display panel with the narrow frame as much as possible. please refer to the panel of FIG. 3, in this embodiment, when setting the groove 309 closest to the display area 12, a distance L3 between a boundary of the groove 309 and an outer boundary of the display area 12 is set to be greater than or equal to 1200 μm. Furthermore, a distance L4 between the groove 309 near the edge of the non-display area 11 and the edge of the non-display area is greater than or equal to 30 μm, so as to ensure that the display panel has a narrow frame and can bind terminals in the non-display area. Moreover, in order to ensure performance of the optical structure layer formed by ink jet printing, in this embodiment, after the cutting process is completed, a thickness of an edge of the second optical structure layer 310 corresponding to the edge of the display area 12 is greater than a thickness of a part of the second optical structure layer 310 in the non-display area 11.

Furthermore, the present disclosure further provides a display device comprising a display panel. Optical structure layers corresponding to a micro-lens pattern are not provided in the display panel. When the optical structure layers are formed by ink jet printing, it is set according to the structure in the above embodiment. Moreover, when cutting off a redundant structure, an angle between a dam and a cutting line is the angle provided in the above embodiment, so that the dam is not torn during cutting, which effectively ensures a quality and reliability of the display panel.

The display panel provided by the embodiments of the present disclosure is described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A display panel, comprising a display area and a non-display area disposed on at least one side of the display area, and further comprising:
    an array substrate;
    a first optical structure layer disposed on the array substrate and provided with a plurality of pixel openings in the display area, at least two grooves in the non-display area, and one dam between two adjacent grooves, wherein each of the grooves intersects with an edge of the non-display area away from the display area at a first included angle in an extending direction of each of the grooves, and the first included angle is 80° to 100°; and
    a second optical structure layer disposed on the first optical structure layer and filling the pixel openings, wherein a refractive index of the second optical structure layer is greater than a refractive index of the first optical structure layer, and a thickness of a part of the second optical structure layer corresponding to an edge of the display area is greater than a thickness of a part of the second optical structure layer in the non-display area.

2. The display panel according to claim 1, wherein a sidewall of each of the grooves intersects with the edge of the non-display area away from the display area in the extending direction of each of the grooves at a second included angle, and the second included angle is 80° to 100°.

3. The display panel according to claim 2, wherein a central axis of the grooves intersects with the edge of the non-display area away from the display area in the extending direction of each of the grooves at a third included angle, and the third included angle is 80° to 100°.

4. The display panel according to claim 3, wherein each of both ends of each of the grooves extends to intersect with the edge of the non-display area away from the display area at the first included angle.

5. The display panel according to claim 4, wherein the first included angle, the second included angle, and the third included angle are all 90°.

6. A display panel, comprising a display area and a non-display area disposed on at least one side of the display area, and further comprising:
    an array substrate;
    a first optical structure layer disposed on the array substrate and provided with a plurality of pixel openings in the display area, at least two grooves in the non-display area, and one dam between two adjacent grooves, wherein each of the grooves intersects with an edge of the non-display area away from the display area at a first included angle in an extending direction of each of the grooves, and the first included angle is 80° to 100°; and
    a second optical structure layer disposed on the first optical structure layer and filling the pixel openings, wherein a refractive index of the second optical structure layer is greater than a refractive index of the first optical structure layer.

7. The display panel according to claim 6, wherein a sidewall of each of the grooves intersects with the edge of the non-display area away from the display area in the extending direction of each of the grooves at a second included angle, and the second included angle is 80° to 100°.

8. The display panel according to claim 7, wherein a central axis of each of the grooves intersects with the edge of the non-display area away from the display area in the extending direction of each of the grooves at a third included angle, and the third included angle is 80° to 100°.

9. The display panel according to claim 8, wherein each of both ends of each of the grooves extends to intersect with the edge of the non-display area away from the display area at the first included angle.

10. The display panel according to claim 9, wherein the first included angle, the second included angle, and the third included angle are all 90°.

11. The display panel according to claim 6, wherein each of the grooves comprises:
    a first groove portion;
    a second groove portion intersecting with the edge of the non-display area away from the display area; and
    a groove connecting portion connecting the first groove portion and the second groove portion;
    wherein widths of the first groove portion and the second groove portion are both less than a width of the groove connecting portion.

12. The display panel according to claim 11, wherein the width of the first groove portion is same as the width of the second groove portion.

13. The display panel according to claim 11, wherein in two adjacent grooves, a width of the groove connecting portion of the groove close to the display area is greater than a width of the groove connecting portion of the groove away from the display area.

14. The display panel according to claim 13, wherein in two adjacent grooves, a width of the first groove portion of the groove close to the display area is equal to a width of the first groove portion of the groove away from the display area, and a width of the second groove portion of the groove close to the display area is equal to a width of the second groove portion of the groove away from the display area.

15. The display panel according to claim 6, wherein the dam intersects with the edge of the non-display area away from the display area, at an intersection of the dam and the edge of the non-display area away from the display area, a first tangent formed by an edge trajectory corresponding to the edge of the non-display area and a second tangent formed by a dam trajectory corresponding to the dam form a fourth included angle, and the fourth included angle is 80° to 100°.

16. The display panel according to claim 15, wherein the intersection is an intersection of a contour of the dam and the edge trajectory of the edge of the non-display area away from the display area, and the dam trajectory is the contour of the dam.

17. The display panel according to claim 15, wherein the intersection is an intersection of a central axis of the dam in an extending direction of the dam and the edge trajectory of the edge of the non-display area away from the display area, and the dam trajectory is the central axis of the dam in the extending direction of the dam.

18. The display panel according to claim 6, wherein each of the dams comprises a first straight portion, a second straight portion, and a curved portion located between the first straight portion and the second straight portion, and the second straight portion intersects with the edge of the non-display area of the display panel.

19. The display panel according to claim 18, wherein the first optical structure layer is provided with a first dam and a second dam disposed adjacently, one groove is disposed between the first dam and the second dam, and the first dam is close to the edge of the non-display area.

20. The display panel according to claim 6, further comprising:
    a light-emitting layer disposed on the array substrate and comprising a plurality of pixels disposed corresponding to the pixel openings;
    an encapsulation layer disposed on the light-emitting layer; and
    a touch layer disposed on the encapsulation layer and comprising a touch metal layer, wherein the touch metal layer comprises a touch metal grid corresponding to the pixels, and the first optical structure layer is disposed on the touch metal layer.

* * * * *